United States Patent
Henes Neto et al.

(10) Patent No.: US 12,293,247 B2
(45) Date of Patent: May 6, 2025

(54) RF COMMUNICATION DEVICE WITHOUT TEMPORARY CONNECTION LINE, AND MANUFACTURING METHOD

(71) Applicant: NXP B.V., Eindhoven (NL)

(72) Inventors: Egas Carvalho Henes Neto, Graz (AT); Slawomir Rafal Malinowski, Graz (AT); Ivan Jesus Rebollo Pimentel, Graz (AT); Thomas Pichler, Graz (AT)

(73) Assignee: NXP B.V., Eindhove (NL)

( * ) Notice: Subject to any disclaimer, the term of this patent is extended or adjusted under 35 U.S.C. 154(b) by 488 days.

(21) Appl. No.: 17/806,547

(22) Filed: Jun. 13, 2022

(65) Prior Publication Data

US 2022/0414357 A1 Dec. 29, 2022

(30) Foreign Application Priority Data

Jun. 28, 2021 (EP) .................................... 21182107

(51) Int. Cl.
*G06K 7/10* (2006.01)
*G06K 19/07* (2006.01)

(52) U.S. Cl.
CPC ..... *G06K 7/10356* (2013.01); *G06K 19/0726* (2013.01)

(58) Field of Classification Search
CPC ................. G06K 7/10356; G06K 19/0726
See application file for complete search history.

(56) References Cited

U.S. PATENT DOCUMENTS

| | | | |
|---|---|---|---|
| 7,109,867 B2 * | 9/2006 | Forster ............... | G08B 13/2448 340/572.5 |
| 7,579,906 B2 | 8/2009 | Kumar et al. | |
| 7,817,015 B1 | 10/2010 | Tiernay et al. | |
| 7,992,062 B2 * | 8/2011 | Saint-Laurent ............................. | G01R 31/318575 714/731 |
| 10,650,201 B1 * | 5/2020 | Maguire ............. | G06K 19/0724 |
| 11,526,719 B2 * | 12/2022 | Preikszat ......... | G06K 19/07775 |
| 2003/0092396 A1 * | 5/2003 | Fifield .................. | H05K 1/0237 455/81 |

(Continued)

FOREIGN PATENT DOCUMENTS

| | | |
|---|---|---|
| KR | 10-1068313 B1 | 9/2011 |
| KR | 10-1101998 B1 | 1/2012 |
| WO | 2014008569 A2 | 1/2014 |

OTHER PUBLICATIONS

NXP Data Sheet "Ucode 7/7m" May 12, 2022; Internet: https://www.nxp.com/products/rfid-nfc/ucode-rain-rfid-uhf/ucode-7-7m:SL3S1204?&&linkline=Data-Sheet#documentation.

*Primary Examiner* — Thomas D Alunkal

(57) ABSTRACT

It is described an RF communication device comprising:
i) an RF antenna functionality;
ii) at least one antenna pad connected to the RF antenna functionality;
iii) a further functionality which is not an RF antenna functionality; and
iv) at least one non-antenna pad electrically connected to the further functionality.

The antenna pad and the non-antenna pad are arranged to be short-circuited with each other, and the non-antenna pad is electrically connected via a connection line to the further functionality within the RF communication device.

Further, a method of manufacturing an RF communication device is described.

19 Claims, 4 Drawing Sheets

(56) References Cited

U.S. PATENT DOCUMENTS

| | | | |
|---|---|---|---|
| 2009/0153158 A1* | 6/2009 | Dunn | G01R 31/2822 324/762.01 |
| 2011/0316673 A1* | 12/2011 | Song | G06K 19/07771 340/10.1 |
| 2013/0200165 A1* | 8/2013 | Downie | G06K 19/07749 235/492 |
| 2018/0294043 A1 | 10/2018 | Kim | |

* cited by examiner

RF COMMUNICATION DEVICE WITHOUT TEMPORARY CONNECTION LINE, AND MANUFACTURING METHOD

CROSS-REFERENCE TO RELATED APPLICATIONS

This application claims priority under 35 U.S.C. § 119 to European Patent Application No. 21182107.9, filed on Jun. 28, 2021, the contents of which are incorporated by reference herein.

TECHNICAL FIELD

The present disclosure relates to an RF communication device, in particular an RFID/NFC tag with an antenna pad and a non-antenna pad. Additionally, the present disclosure relates to a method of manufacturing the RF communication device. Further, the present disclosure relates to a method of using a connection line within the RF communication device in order to substitute for a partially external temporary connection line.

The disclosure may hence relate to the technical field of RF, in particular RFID and NFC, communication applications.

TECHNICAL BACKGROUND

RF communication devices such as radio-frequency identification (RFID) tags, commonly referred as RFID inlays, labels or transponders, are widely used to identify an object, to which the tag is attached. The most common application examples of the RFID tags are retail, supply chain management, shipping services, airline luggage tracking, laundry services, etc.

RFID tags are hereby part of RFID systems, which typically include an RFID reader and one or more tags which are associated to one or more objects. The RFID reader is composed by a transmitter section, to transmit the RF signals to the tag, and by a receiver, to receive the modulated information of the tag. The standard communication between a reader and a tag, and vice versa, are specified in protocols.

An RFID tag is generally developed over a planar inlay and includes two antenna segments which form a dipole. The RFID tag comprises an RFID chip which is connected to said antenna segments. FIG. 10 shows a diagram of a conventional RFID chip 200.

The RFID chip 200 contains two RF antenna pads 210 (RF1 and RF2), and an antenna (related) functionality comprising an RF front-end and PMU, a data demodulator, a data modulator, a digital control, and a memory. The RF pads 210 are connected to the antenna terminals (not shown) and receive e.g. an RF field from a reader. The RF front-end and PMU section harvest the incoming energy from the RF pads 210 and generate supply voltage for the circuits of the RFID chip 200. The data demodulator receives the data from the reader and deliver it to the digital control. The data modulator transmits the data back to the reader. The digital control processes both the demodulated data and the protocol commands and handles communication with the memory. The memory stores the identification data. The chip 200 further contains two test pads (TP1 and TP2) 220 which are respectively connected to tester circuitry 225 by temporary connection lines 230 that are arranged partially external of the RFID chip 200. The test pads 220 are used to run the functional test of all chips of a wafer during manufacturing (see FIG. 11 below).

The described conventional RFID chips 200 are semiconductor devices and are manufactured on semiconductor wafers. FIG. 11 shows a semiconductor wafer 201 containing many similar chips (RFID chip preforms). Each square inside the wafer 201 represents a single chip. It is shown in the enlargement that each RFID chip preform has two RF antenna pads 210 and two (non-antenna) test pads 220. The separation of the chips 200 on the wafer 201 is done through scribe lines. The final separation of the chips 200 is done by dicing the wafer 201 through said scribe lines. The test pads 220 are used to run the functional test of all chips 200 of the wafer 201 before dicing. In the scribe lines, there are temporary electrical connection lines (commonly referred to as "sawbow connection") 230, which connect the test pads 220 to the test circuitry (internal circuits) of the chip 200. The tester circuitry 225 interfaces with the external tester in order to run the functional test of the chip 200. The final separation of the chips 200 is done by dicing the wafer 201 through the scribe lines, such that the chips 200 are separated and the (partially chip external) temporary connection lines 230 are broken.

FIG. 12 shows a detailed block diagram of a conventional RFID chip 200. The block diagram shows the test pad 220, the temporary connection line 230, and a test circuitry 225. The border between chip 200 and scribe line is denoted by 280. The test pad 220 is used to run the functional test of the chip 200. The temporary connection line 230 connects the test pad 220 to the test circuitry 225.

Conventionally, the antenna associated with the RFID chip 200 is formed as a slit antenna (with two diploes) having two segments (on both sides of the slit), wherein each antenna segment is connected to an RF antenna pad 210 and a test pad 220. Hereby, the RF antenna pad 210 and the test pad 220 are short-circuited with each other. However, there is conventionally no risk for the RFID tag functionality because the test pads 220 are electrically disconnected from the tester circuitry 225 during the dicing of the wafer (by cutting the temporary connection line 230). This separation is considered necessary, because otherwise, after the antenna assembly phase, the tester circuitry 225 will be connected to the RF antenna pads 210 (due to the short-circuit). This may cause a negative impact over the performance of the RFID tag because more circuitry is then connected to the RF antenna pads 210. Since more circuits are connected to the RF antenna pads 210, the load at these pads (capacitive and resistive) is increased such that a part of the total power available in the RF antenna pads 210 is dissipated by this additional load introduced by the tester circuitry 225.

However, with increasing miniaturization and further development of chip manufacturing techniques, it may be desirable to remove the temporary connection lines.

OBJECT AND SUMMARY

There may be a need to provide an efficient and reliable RF communication device without using a temporary connection line.

An RF communication device, a method of manufacturing the RF communication device, and a method of using according to the independent claims are provided.

According to an aspect of the present disclosure, there is described an RF communication device (e.g. an RFID tag, an RFID IC, etc.), comprising:

i) an RF antenna functionality (device, e.g. an antenna related device),
ii) at least one antenna pad (RF pad) coupled/connected to the RF antenna functionality,
iii) a further (non-antenna) functionality (device, e.g. a test circuitry) which is not an RF antenna functionality, and
iv) at least one non-antenna pad (e.g. a general purpose pad such as a test pad) electrically coupled/connected to the further functionality.

The antenna pad and the non-antenna pad are arranged to be short-circuited with each other (in particular forming one pad that is connected to the same segment of a slit antenna). The non-antenna pad is electrically connected via a connection line to the further functionality within (i.e. no external temporary connection line is used) the RF communication device.

According to a further aspect of the present disclosure, there is described a method of manufacturing an RF communication device (e.g. as described above), the method comprising:
i) providing a wafer with a plurality of RF communication device preforms, wherein the preforms respectively comprise:
ia) an RF antenna functionality,
ib) at least one antenna pad connected to the RF antenna functionality,
ic) a further functionality which is not an RF antenna functionality, and
id) at least one non-antenna pad electrically connected to the further functionality,
ii) connecting, (exclusively) within the RF communication device preforms (i.e. no external temporary connection line is used), the non-antenna pad electrically via a connection line to the further functionality, and
iii) separating the wafer into a plurality of RF communication devices.

According to a further aspect of the present disclosure, there is described a use (method of using) a connection line, arranged completely within an RF communication device between a non-antenna pad and a non-antenna functionality, in order to substitute for a (partially external) temporary connection line.

In the context of the present disclosure, the term "RF communication device" may in particular refer to a device that is enabled to interact with communication via radio frequency RF, in particular using ultra high frequency (UHF). The term "RF communication device" may for example refer to an RF(ID) IC or to an RF(ID) tag (IC and antenna).

In the context of the present disclosure, the term "RF antenna functionality" may in particular refer to a device (or a plurality of devices) that is (are) directly related with an antenna associated to the RF IC, in other words: an antenna-related device. For example, the RF antenna functionality may comprise at least one of a data modulator, a data demodulator, an RF front-end, a digital control. In an embodiment, the RF antenna functionality includes the RF antenna. In another embodiment, the RF antenna functionality refers only to a device related to said RF antenna.

In the context of the present disclosure, the term "further functionality" may in particular refer to a device (or a plurality of devices) that is (are) not directly related with an antenna associated to the RF IC, in other words: a non-antenna-related device. For example, the further functionality may be a test functionality (test circuit) used during manufacturing (and/or during operation) of the RF communication device. Such a test circuit may e.g. comprise an IO buffer and an analog multiplexer (MUX). In an embodiment, said test functionality is not connected to the antenna functionality.

In the context of the present disclosure, the term "RFID" (radio-frequency identification) may refer to a technique that uses electromagnetic fields (RF field) to communicate via short distances, in particular 10 meter or less. The term "RFID device" may refer to any device that has an RFID functionality. An RFID device may include an antenna and an integrated circuit with a transmitter and a receiver. A typical RFID system may include an RFID reader and one or more RFID tags which are associated to one or more objects. In an example, a first RFID device comprises a transmitter to transmit the RF signals to a second RFID device, and a receiver, to receive the modulated information of the second RFID device. The standard communication between RFID devices are specified in protocols. An RFID functionality may for example be implemented in a tag, a smart card, a card reader, or a mobile phone.

In the context of the present application, the term "NFC" may refer to Near Field Communication which may be a short-range wireless technology (distances measured in centimeters). In order to make two NFC devices communicate, users may bring them close together or even make them touch. NFC may be considered as an established standard. In the present document, the NFC standard may be considered as a special form of RFID. In the context of the present document, the term "NFC device" may refer to any device that has an NFC functionality as described above. An NFC functionality may for example be implemented in a tag, a smart card, a card reader, or a mobile phone.

In the context of the present disclosure, the term "connection line within the RF communication device" may refer to the circumstance that an electric connection (line) between the non-antenna pad and the further functionality is completely (exclusively) within the RF communication device. This is in contrast to conventional approaches, wherein a test pad and a test circuit are connected by a temporary connection line that is partially external of the RF chip, so that it will be cut during wafer separation.

According to an exemplary embodiment, the present disclosure may be based on the idea that an RF communication device can be provided without a partially chip-external temporary connection line, while still being efficient, reliable, and design flexible, when a connection line between a non-antenna pad and a further (non-antenna) functionality is provided completely within the RF communication device. In this manner, the temporary connection line can be removed which circumstance may enable new approaches of manufacturing. For example, the miniaturization (smaller scribe lines) may be improved or next generation developments of dicing techniques (e.g. plasma dicing) may be applied.

While conventionally, the temporary connection line has been mandatory for proper testing and functioning, it has now been found by the Inventors that an efficient and reliable testing is still enabled, while the connection line does not have to be temporary, thereby opening a new field of manufacturing options. Even though the antenna pad and the non-antenna pad are short-circuited, the RF communication by the antenna pad may not be negatively influenced, since the non-antenna pad can be electrically isolated from the further functionality, for example by providing an electric control element between the non-antenna pad and the further functionality.

DESCRIPTION OF EXEMPLARY EMBODIMENTS

According to an embodiment, the electrical connection between the non-antenna pad and the further functionality is free of a (partially external) temporary connection line. This may enable the application of a new generation of manufacturing techniques and/or further miniaturization.

According to a further embodiment, the non-antenna pad comprises a test pad, and the further functionality comprises a test circuit device. Even though the temporary connection line is omitted, a reliable test functionality may still be enabled.

According to a further embodiment, the RF communication device is one of the group which consists of an RFID device, a tag, an IC, a smart card, a smart phone. In particular, the device is a passive device. The device may be an RFID and/or an NFC device.

According to a further embodiment, the RF communication device further comprises a control element arranged at the connection line between the non-antenna pad and the further functionality. Implementing the control element directly between pad and circuit may yield an efficient switching functionality.

According to a further embodiment, the control element is configured to electrically connect the non-antenna pad and the further functionality in a first mode, in particular a test mode. According to a further embodiment, the control element is configured to electrically disconnect the non-antenna pad and the further functionality in a second mode, in particular a non-test mode (see FIG. 3 for a detailed example).

According to a further embodiment, the second mode is an RF communication mode, and, during the RF communication mode, the non-antenna pad is electrically isolated from the further functionality. Thus, a reliable and robust RF communication is enabled (see e.g. FIG. 9), even though antenna pad and non-antenna pad are short-circuited with each other.

According to a further embodiment, the control element comprises a transmission gate, in particular an inverter. Thereby, the control element may be implemented in a straightforward manner using established measures.

According to a further embodiment, the control element comprises at least two transistors, in particular an NMOS transistor and a PMOS transistor. Also hereby, the control element may be implemented in a straightforward manner using established measures.

According to a further embodiment, the RF communication device further comprises: a peak detector arranged between the non-antenna pad and the control element, in particular wherein the peak detector comprises a positive peak detector element and a negative peak detector element. The application of the peak detector may decrease an undesired negative voltage at the further functionality (e.g. the analog-multiplexer).

According to a further embodiment, the device further comprises a charge pump. The charge pump may be connected to the control element. The application of the charge pump may decrease an undesired negative voltage at the further functionality (e.g. the analog-multiplexer).

According to a further embodiment, the RF communication device further comprises: an antenna that is configured as a slit, in particular single-slit, antenna with at least two segments, wherein the antenna pad and the non-antenna pad (form a common pad that is) are connected to the same antenna segment.

According to a further embodiment of the method, the wafer is free of a temporary connection line, which temporary connection line is disconnected during the separating, between the non-antenna pad and the further functionality. In this manner, smaller scribe lines can be provided and/or new dicing methods may be applied.

BRIEF DESCRIPTION OF THE DRAWINGS

The illustrations in the drawings are schematic. In different drawings, similar or identical elements are provided with the same reference signs.

DETAILED DESCRIPTION OF THE DRAWINGS

Figure 1:
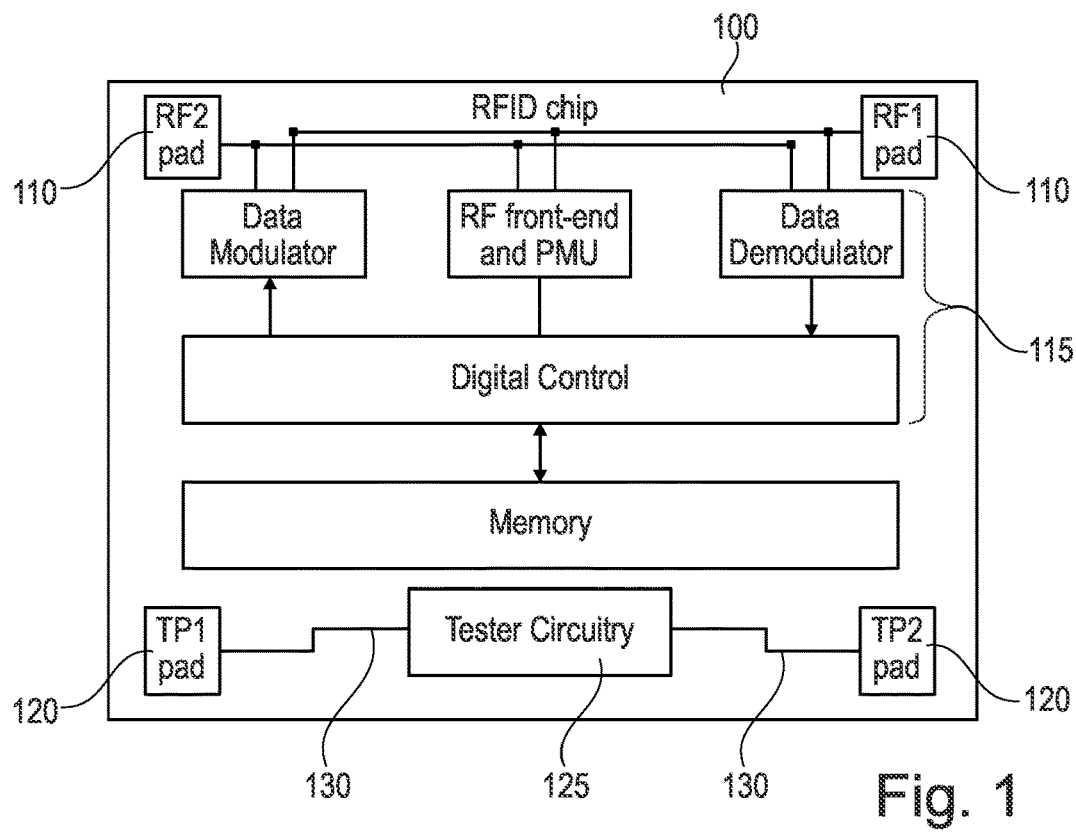
FIG. 1 illustrates an RF communication device according to an exemplary embodiment of the present disclosure.

Before, referring to the drawings, an exemplary embodiment will be described in further detail, and some basic considerations will be summarized based on which embodiments of the disclosure have been developed.

According to an exemplary embodiment, there is described a single-slit antenna solution is an RFID assembly technology which can enable easier and low cost antenna designs. In this assembly solution, one or more non-antenna pads of the RFID chip (RF communication device) are shorted-circuited to the RF pads (antenna pads). In the state-of-the-art single-slit antenna solution implementation, the non-antenna pads short-circuited to the RF pads are electrically disconnected and therefore can be safely short-circuited to the RF pads. The connection from the non-antenna pads to the internal nodes (test circuitry) of the chip is done via the scribe lines (separation between adjacent chips) of the semiconductor wafer and broken after the dicing step. This connection is referred here as "saw bow connection" (temporary connection line). The present disclosure is about an electrical circuitry that allows the removal of the saw bow but keeping its functionality. In addition, it may enable smaller scribe lines being beneficial for next generation dicing techniques. This novel approach is isolating the RF signals to the internal nodes through the non-antenna pads allowing them to be short-circuited to the RF pads safely. A challenge of passive RFID tags may be seen in blocking the RF signal before being powered. It may be desirable to electrically isolate RF signals from a pad to an internal node, controlled by a passive device.

Figure 10:
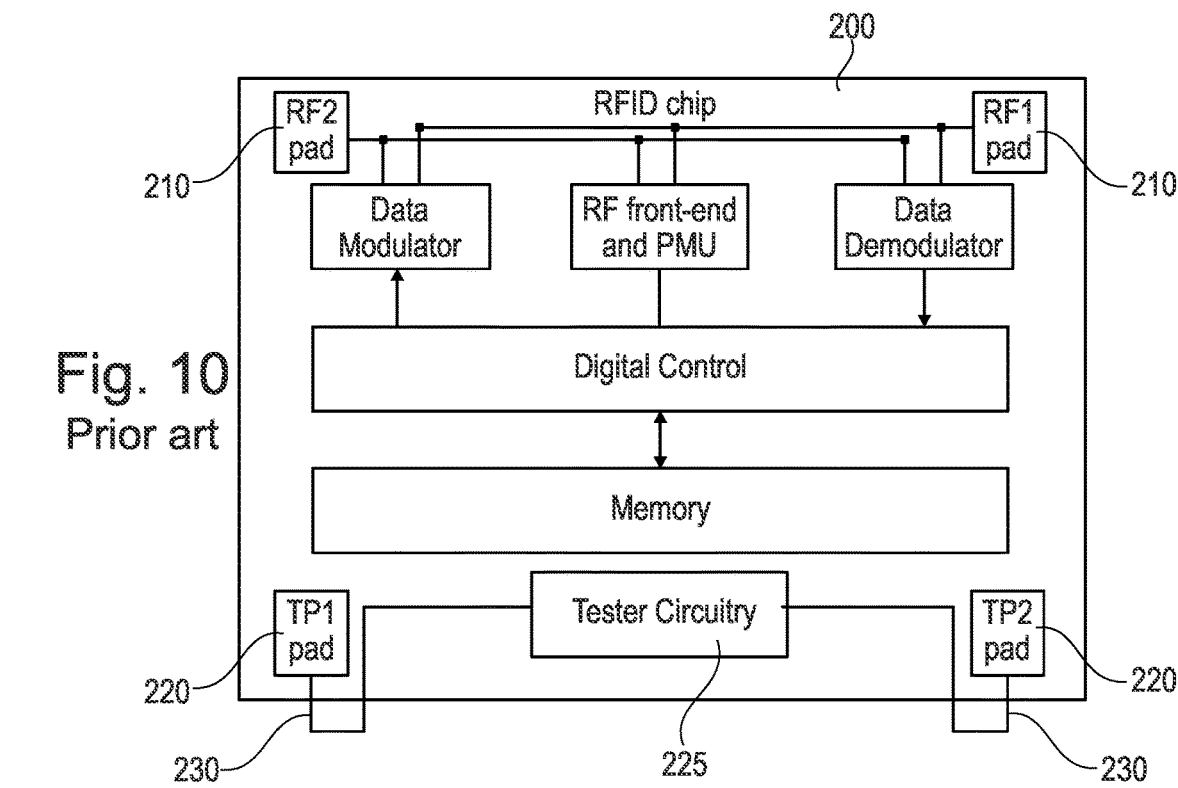
FIG. 10 illustrates a conventional RFID chip.
Figure 11:
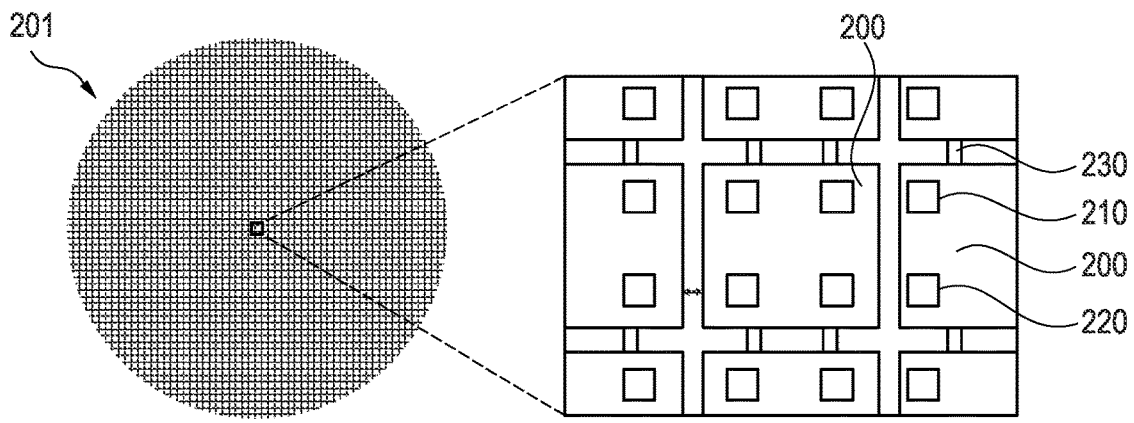
FIG. 11 illustrates a conventional wafer with external temporary connection lines.
Figure 12:
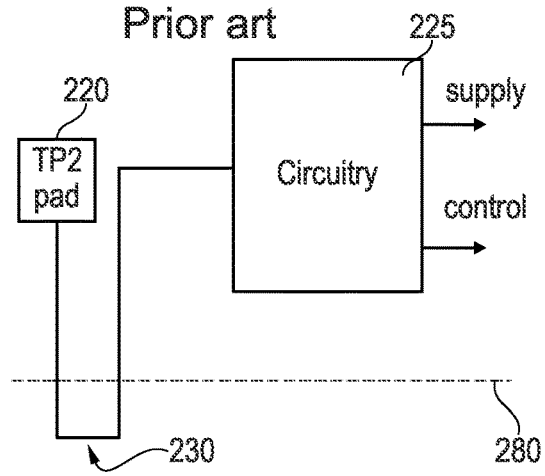
FIG. 12 illustrates a conventional RFID chip preform with an external temporary connection line.

FIG. 1 illustrates an RF communication device 100 (in this example an RFID IC of an RFID tag) according to an exemplary embodiment of the present disclosure. The RF communication device 100 comprises an RF antenna functionality 115 with an RF front-end, a data modulator, a data demodulator, a digital control, and a memory. Two antenna pads 110 are connected to the RF antenna functionality 115. The RF communication device 100 further comprises a further functionality 125 (in the example shown a test circuit) which is not an RF antenna functionality. Two non-antenna pads 120 (test pads) are electrically connected to the further functionality 125. The antenna pad 110 and the non-antenna pad 120 are arranged to be short-circuited with each other (not shown, see FIG. 2 below). The non-antenna pads 120 are electrically connected via a connection line 130 to the further functionality 125, respectively, within the RF communication device 100. It can be seen that the electrical connection 130 between the non-antenna pads 120 and the further functionality 125 is free of a partially (chip-) external temporary connection line 230 (compare the conventional examples in FIGS. 10 to 12 above).

Figure 2:
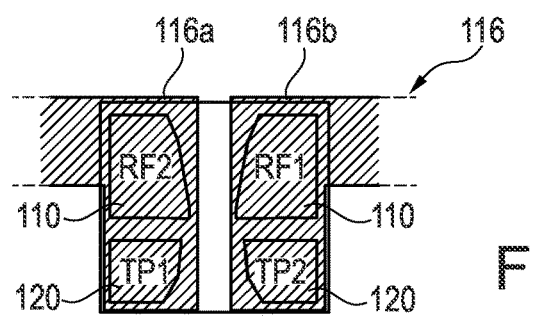
FIG. 2 illustrates an RF communication device with a single slit antenna according to an exemplary embodiment of the present disclosure.

FIG. 2 illustrates an RF communication device 100 with a single slit antenna design according to an exemplary embodiment of the present disclosure. The RF communication device 100 further comprises an antenna 116 with two antenna segments 116a, 116b which are divided by a slit. The segments 116a, 116b hereby form diploes of the antenna 116. A first antenna pad 110 and a first non-antenna pad 120 are short-circuited within a common pad that is coupled to the first antenna segment 116a. A second antenna pad 110 and a second non-antenna pad 120 are short-circuited in a further common pad that is coupled to the second antenna segment 116b.

Figure 3:
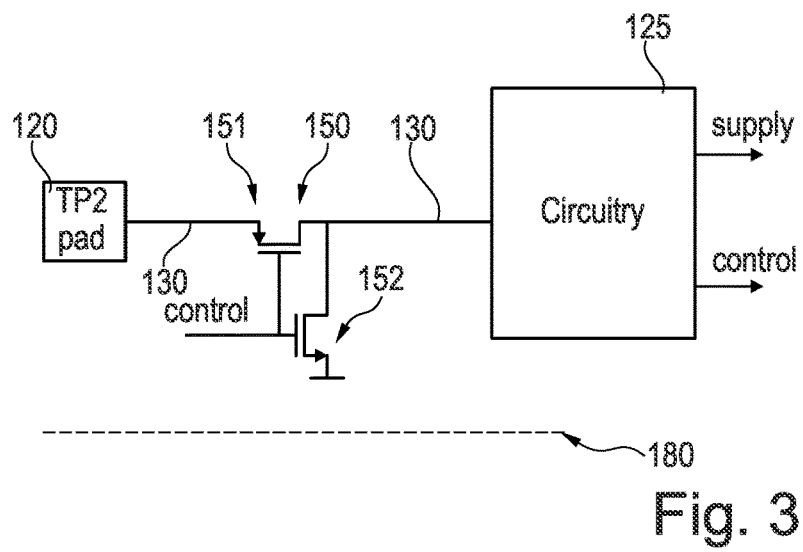
FIGS. 3 to 5 illustrate respectively an RF communication device with a control element according to exemplary embodiments of the present disclosure.

FIG. 3 illustrates an RF communication device 100 with a control element 150 according to an exemplary embodiment of the present disclosure. The control element 150 is implement with two transistors 151, 152, being an NMOS 152 and a PMOS 151 transistor, that implement an inverter function. If a control signal is "0", the non-antenna pad 120 is bypassed through the PMOS 151 and connected to the test circuitry 125. If the control signal is "1", the test circuitry 125 is isolated from the non-antenna pad 120 and the node is pulled-down. Control signal being "1" would be an isolated mode (isolating TP2/circuitry) and "0" a connection (test) mode.

Connected mode: control signal starts "1" and later is moved to "0", connecting the non-antenna pad 120 and the test circuitry 125. The supply voltage, which sets "1" of control signal, is generated from a stimulus at the non-antenna pad 120. There is a voltage drop between the non-antenna pad 120 voltage and supply voltage, which is caused by the PMOS Vth, in a way the supply voltage and control, if "1" logic, can be increased by increasing the non-antenna pad 120 voltage. If the non-antenna pad 120 voltage is increased, the voltage also increases and once it achieves the control circuit threshold, the control signal is de-asserted "0", thereby connecting the non-antenna pad 120 to the test circuit 125, thus allowing testability.

Isolated mode (RF communication mode): the control signal starts "1" and it keeps "1". Supply voltage is generated through the RF front-end and the supply voltage is high enough to block the RF signal present at the non-antenna pad 120. In other words, the control signal, which is defined by the supply voltage being higher than the RF signal at the non-antenna pad 120, is applied in a way that the RF signal can be isolated by the PMOS 151.

In other words, the control element 150 is configured to electrically connect the non-antenna pad 120 and the further functionality 125 in a first mode, in particular a test mode (connection mode), and the control element 150 is configured to electrically disconnect the non-antenna pad 120 and the further functionality 125 in a second mode, in particular a non-test mode (isolated mode). The second mode is an RF communication mode, and, during the RF communication mode, the non-antenna pad 120 is electrically isolated from the further functionality 125.

Figure 4:
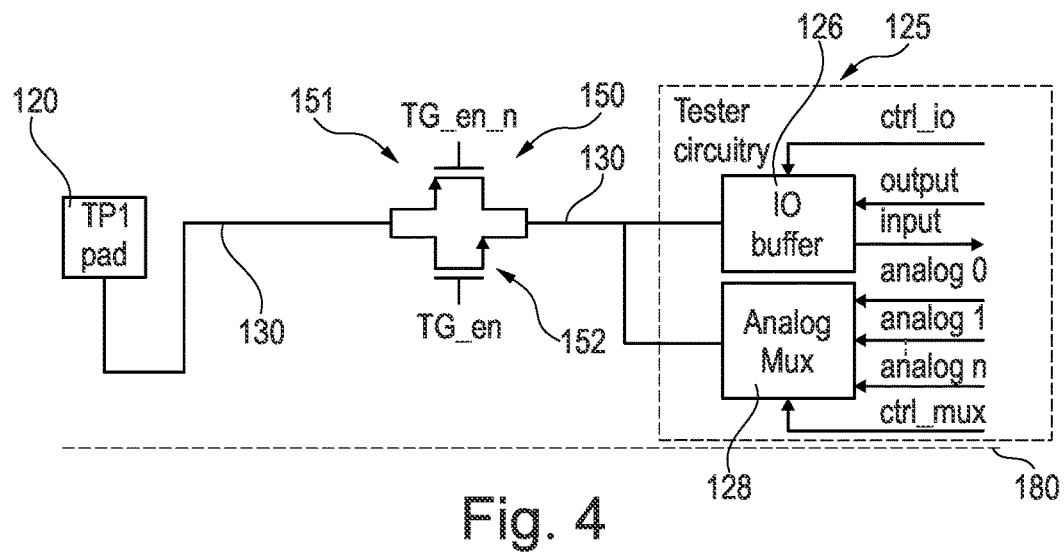

FIG. 4 illustrates an RF communication device 100 with a control element 150 according to an exemplary embodiment of the present disclosure. The control element 150 is implemented as a transmission gate between the non-antenna pad 120 and the test circuit 125, including IO buffer 126 and analog-multiplexer (mux) block 128. Reference sign 180 denotes the border between device 100 and scribe line. In test mode, the control element 150 is enabled and the test circuit 125 is connected to the non-antenna pad 120. After the antenna assembly, since the chip is no more tested, the control element 150 is disabled, thereby isolating the test circuit 125 from the non-antenna pad 120, and consequently, also isolating the test circuit 125 from the antenna pad 110.

Once the control element 150 circuit has less load (capacitive and resistive) compared with the test circuit 125, the introduction of the control element 150 contributes to minimize the impact of the removal of the temporary connection line 230 over chip parameters like impedance and power.

Figure 5:
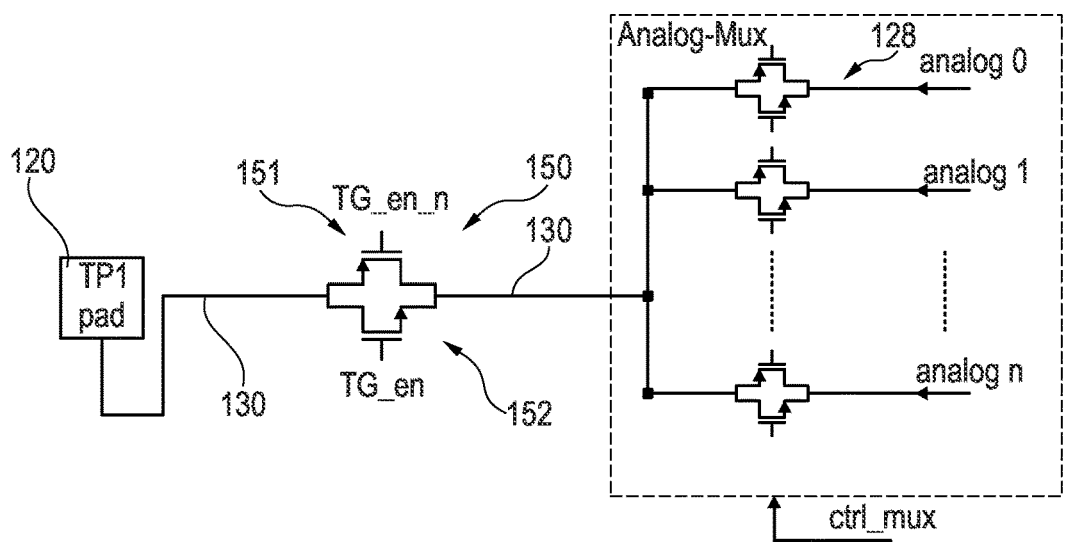

FIG. 5 illustrates an RF communication device 100 with a control element 150 according to an exemplary embodiment of the present disclosure. The design is similar to the one showed in FIG. 4, the difference being that the TO buffer block 126 is omitted by simplicity and the analog-mux 128 is shown in more detail.

Figure 6:
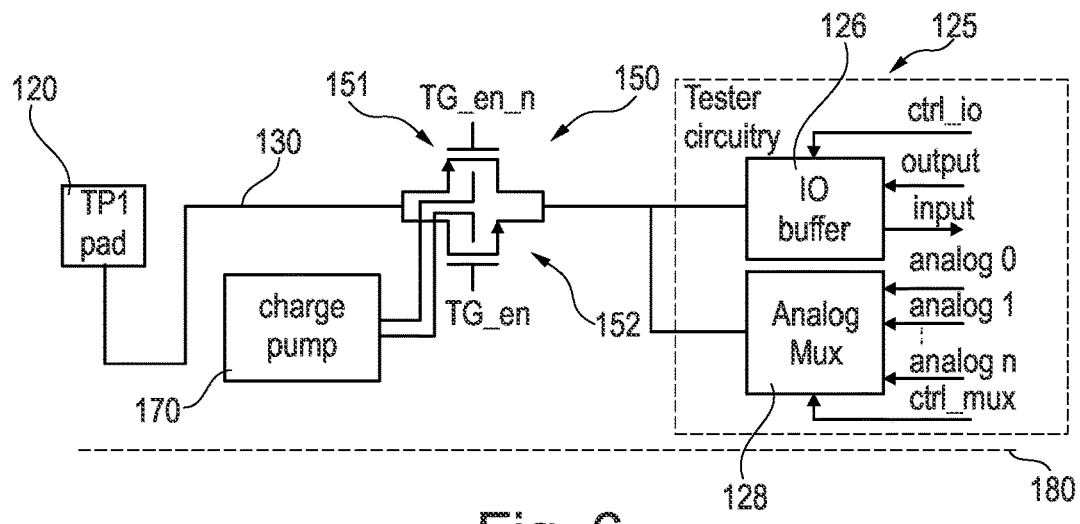
FIG. 6 illustrates an RF communication device with a charge pump according to an exemplary embodiment of the present disclosure.

FIG. 6 illustrates an RF communication device 100 with a charge pump 170 according to an exemplary embodiment of the present disclosure. The design is very similar to the one shown in FIG. 4 with the difference being that a charge pump 170 is connected to the transmission gate 150. The application of the charge pump 170 is to provide a proper bias voltage to the bulk terminals of the devices of the transmission gate, in a way the parasitic devices inherent to the MOS transistors (151 and 152 in FIG. 6), like diodes and bipolar transistors, are prevented to be triggered.

Figure 7:
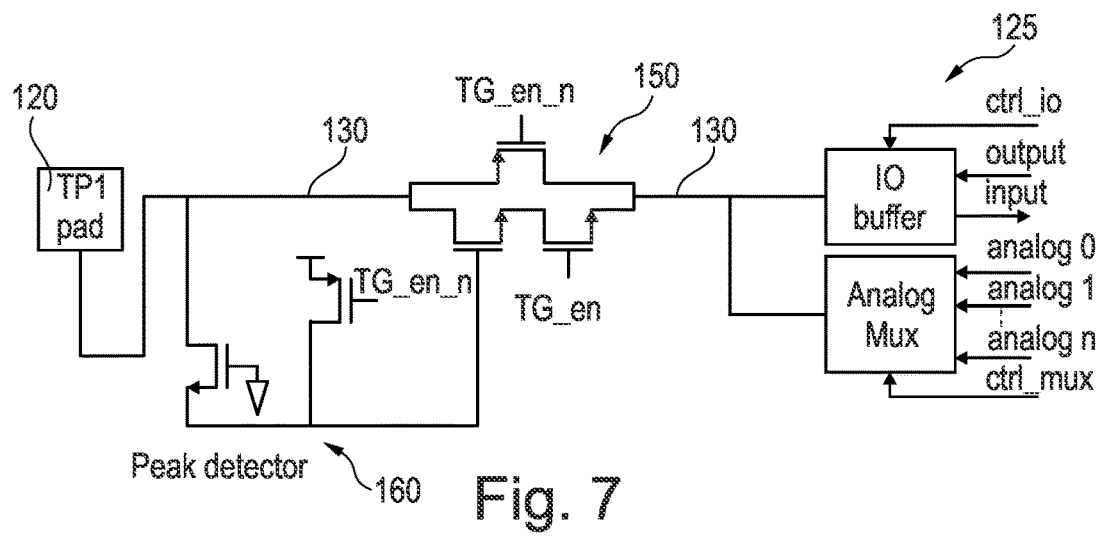
FIG. 7 illustrates an RF communication device with a peak detector according to an exemplary embodiment of the present disclosure.

FIG. 7 illustrates an RF communication device 100 with an additional peak detector 160, between the non-antenna pad 120 and the control element 150, according to an exemplary embodiment of the present disclosure. The application of the peak detector 160 can also decrease an undesired negative voltage at the test circuit 125, in particular the analog-mux 128.

Figure 8:
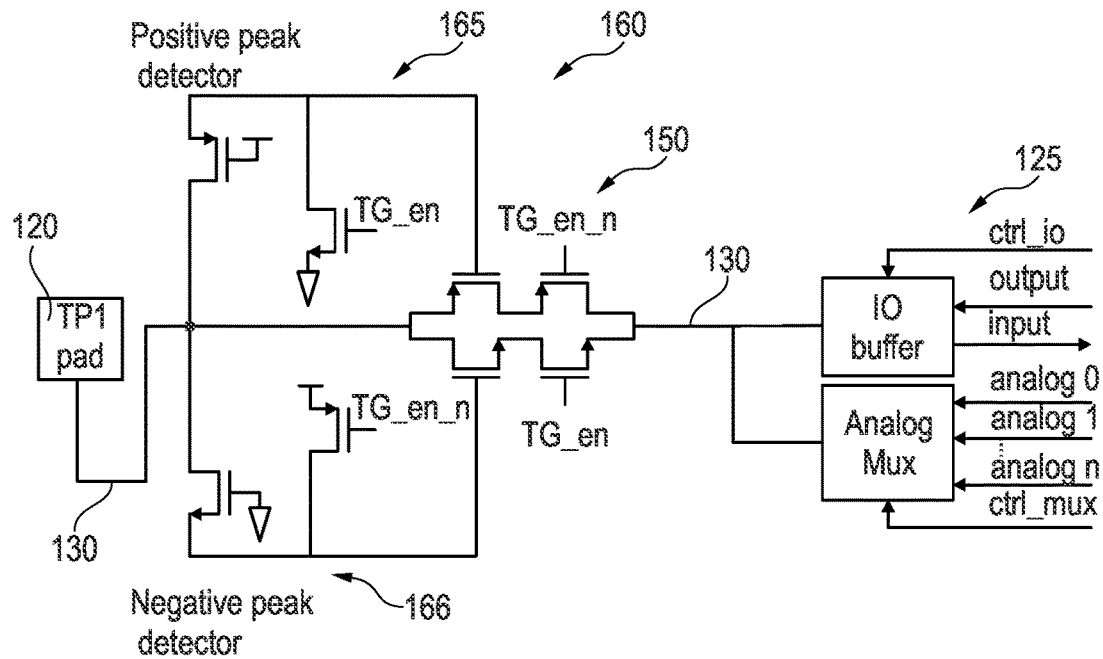
FIG. 8 illustrates an RF communication device with a positive peak detector element and a negative peak detector element according to an exemplary embodiment of the present disclosure.

FIG. 8 illustrates an RF communication device 100 with a positive peak detector element 165 and a negative peak detector element 166 according to an exemplary embodiment of the present disclosure. The design is very similar to the one shown in FIG. 7 with the difference being that the peak detector 160 comprises a positive peak detector element 165 and a negative peak detector element 166.

Figure 9:
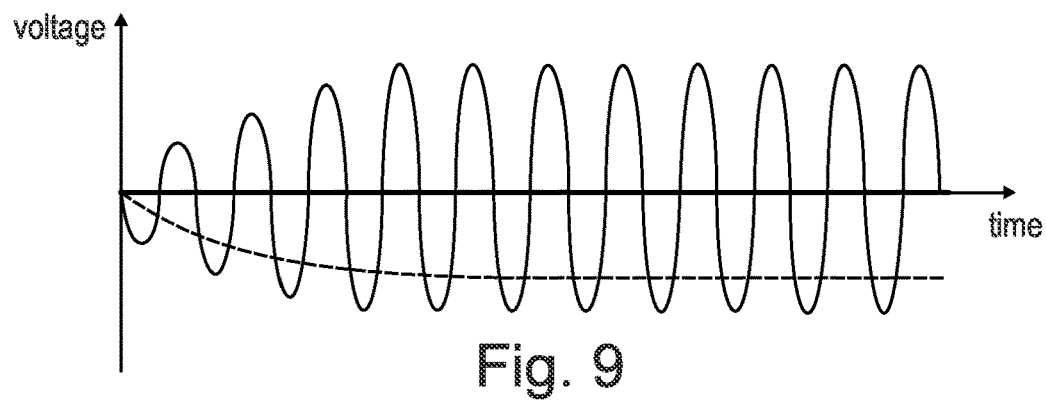
FIG. 9 illustrates a waveform at an antenna pad of an RF communication device according to an exemplary embodiment of the present disclosure.

FIG. 9 illustrates a waveform (voltage vs. time) at power-up, for example according to the embodiment described in FIG. 8 above. The voltage at the RF antenna pads 110 starts to grow, and then stabilizes. This is the typical power-up behavior when a reader is turned-on and RFID tags in the same region of the reader are energized. It can be seen that, even though the antenna pad 110 and the non-antenna pad 120 are short-circuited, the waveform is as expected and desired (no negative impact from the non-antenna pad 110 to further functionality 125 connection 130).

In this specification, embodiments have been presented in terms of a selected set of details. However, a person of ordinary skill in the art would understand that many other embodiments may be practiced which include a different selected set of these details. It is intended that the following claims cover all possible embodiments.

REFERENCE NUMERALS

100 RF communication device, RFID tag
110 Antenna pad (RF pad)
115 Antenna functionality (antenna-related device)
116 Antenna
116a First segment
116b Second segment
120 Non-antenna pad (test pad)
125 Non-antenna functionality (non-antenna-related device, test circuitry)
126 IO buffer
128 Analog Multiplexer (MUX)
130 Connection line
150 Control element
151 First transistor
152 Second transistor
160 Peak detector
165 Positive peak detector element
166 Negative peak detector element
170 Charge pump
180 Separation line, scribe line
200 Conventional RFID chip
201 Conventional wafer
210 Conventional RF pad
215 Conventional antenna functionality
220 Conventional test pad
225 Conventional test circuitry
230 Conventional saw bow
280 Conventional scribe line

The invention claimed is:

1. A radio frequency (RF) communication device, comprising an integrated circuit (IC) chip that contains:
a first pad configured to be electrically coupled to a first antenna segment, and configured to receive RF energy from the first antenna segment;
an RF antenna circuit electrically coupled to the first pad;
a second pad configured to be electrically coupled to the first antenna segment, and configured to receive the RF energy from the first antenna segment;
a test circuit configured to generate a control signal based on the RF energy; and
a first control element coupled between the test circuit and the second pad, wherein the first control element is configured to receive the control signal, wherein when the control signal has a first value, the first control element is configured to operate in a test mode in which the first control element electrically couples the test circuit and the second pad, and when the control signal has a second value, the first control element is configured to operate in an RF communication mode in which the first control element electrically isolates the test circuit from the second pad.

2. The RF communication device according to claim 1, wherein the RF communication device is one of a group which consists of an RF identification (RFID) device, an RFID tag, and an RFID IC.

3. The RF communication device according to claim 1, wherein the first control element comprises an inverter.

4. The RF communication device according to claim 1, wherein the first control element comprises at least two transistors.

5. The RF communication device according to claim 4, wherein the at least two transistors comprise an NMOS transistor and a PMOS transistor.

6. The RF communication device according to claim 1, further comprising:
a peak detector arranged between the second pad and the first control element.

7. The RF communication device according to claim 6, wherein the peak detector comprises a positive peak detector element and a negative peak detector element.

8. The RF communication device according to claim 1, wherein the first control element comprises a charge pump.

9. The RF communication device according to claim 1, further comprising:
a third pad contained within the IC chip and electrically coupled to the RF antenna circuit;
a fourth pad contained within the IC chip; and
an antenna coupled to the IC chip, wherein the antenna is configured as a slit antenna that includes the first antenna segment and a second antenna segment, wherein the first pad and the second pad are connected to the first antenna segment, the third pad and the fourth pad are connected to the second antenna segment, and the first and second antenna segments are divided by a slit.

10. The RF communication device according to claim 9, wherein the antenna is configured as a single-slit antenna.

11. A method of manufacturing an RF communication device, the method comprising:
providing a wafer with a plurality of RF communication device preforms, wherein each of the preforms include
a first pad configured to be electrically coupled to a first antenna segment, and configured to receive RF energy from the first antenna segment;
an RF antenna circuit electrically coupled to the first pad;
a second pad configured to be electrically coupled to the first antenna segment, and configured to receive the RF energy from the first antenna segment;
a test circuit configured to generate a control signal based on the RF energy; and
a first control element coupled between the test circuit and the second pad, wherein the first control element is configured to receive the control signal, wherein when the control signal has a first value, the first control element is configured to operate in a test mode in which the first control element electrically couples the test circuit and the second pad, and when the control signal has a second value, the first control element is configured to operate in an RF communication mode in which the first control element electrically isolates the test circuit from the second pad.

12. The RF communication device according to claim 1, further comprising:
the first antenna segment coupled between the first and second pads, wherein the first antenna segment short circuits the first and second pads.

13. The RF communication device according to claim 12, wherein the first antenna segment is developed over a planar inlay.

14. The RF communication device according to claim 1, wherein the test circuit generates the control signal based on the RF energy received at the second pad.

15. The RF communication device according to claim 1, wherein:
   when the RF communication device is operating in the test mode, the test circuit generates the control signal with a first value that causes the first control element to electrically couple the test circuit and the second pad; and
   when the RF communication device is operating in the RF communication mode, the RF antenna circuit harvests the RF energy from the first pad, generates a supply voltage for the RF antenna circuit, and produces and transmits modulated information, and the test circuit generates the control signal with a second value that causes the first control element to electrically isolate the test circuit from the second pad.

16. The RF communication device according to claim 1, wherein within the IC chip, the first control element and the RF antenna circuit are not electrically connected.

17. The RF communication device according to claim 1, wherein the test circuit comprises an IO buffer and a multiplexer.

18. The RF communication device according to claim 3, wherein the inverter comprises:
   a node between the inverter and the test circuit;
   a PMOS transistor with a first terminal coupled to the second pad, a second terminal coupled to the node and to the test circuit, and a gate configured to receive the control signal; and
   an NMOS transistor with a first terminal coupled to the node and to the test circuit, a second terminal that enables the node to be pulled-down when the control signal has the second value, and a gate configured to receive the control signal.

19. The RF communication device according to claim 9, wherein the IC chip further comprises:
   a second control element coupled between the test circuit and the fourth pad, wherein the second control element is configured to receive the control signal, wherein when the control signal has the first value, the second control element is configured to operate in the test mode in which the second control element electrically couples the test circuit and the fourth pad, and when the control signal has the second value, the second control element is configured to operate in the RF communication mode in which the second control element electrically isolates the test circuit from the fourth pad.

* * * * *